United States Patent
Uzoh et al.

[19]

[11] Patent Number: 6,140,234
[45] Date of Patent: Oct. 31, 2000

[54] METHOD TO SELECTIVELY FILL RECESSES WITH CONDUCTIVE METAL

[75] Inventors: Cyprian Emeka Uzoh, Hopewell Junction; Stephen Edward Greco, Lagrangeville, both of N.Y.

[73] Assignee: International Business Machines Corporation, Armonk, N.Y.

[21] Appl. No.: 09/009,824

[22] Filed: Jan. 20, 1998

[51] Int. Cl.⁷ .................................................. H01L 21/44
[52] U.S. Cl. .......................... 438/678; 438/670; 438/675; 438/677
[58] Field of Search .................................. 438/628, 678, 438/635, 639, 648, 675, 677, 670; 458/951; 45/679

[56] References Cited

U.S. PATENT DOCUMENTS

| | | | |
|---|---|---|---|
| 4,560,435 | 12/1985 | Brown et al. | 156/643 |
| 5,098,860 | 3/1992 | Chakravorty et al. | 437/195 |
| 5,151,168 | 9/1992 | Gilton et al. | 205/123 |
| 5,162,260 | 11/1992 | Liebovitz et al. | 437/195 |
| 5,246,879 | 9/1993 | Hsu et al. | 437/180 |
| 5,276,290 | 1/1994 | Bladon | 174/262 |
| 5,316,974 | 5/1994 | Crank | 437/190 |
| 5,399,528 | 3/1995 | Liebovitz et al. | 437/195 |
| 5,436,504 | 7/1995 | Chakravorty et al. | 257/758 |
| 5,585,308 | 12/1996 | Sardella | 437/190 |
| 5,604,155 | 2/1997 | Wang | 437/190 |
| 5,604,156 | 2/1997 | Chung et al. | 437/195 |
| 5,789,320 | 8/1998 | Andricacos et al. | 438/678 |
| 5,821,168 | 10/1998 | Jain | 438/692 |

FOREIGN PATENT DOCUMENTS

| | | |
|---|---|---|
| 0 279 588 A2 | 8/1988 | European Pat. Off. . |
| 0 751 566 A2 | 2/1997 | European Pat. Off. . |
| 4-372171 | 12/1992 | Japan . |
| 06291194 | 10/1994 | Japan . |
| 09017790 | 1/1997 | Japan . |

*Primary Examiner*—David Nelms
*Assistant Examiner*—Reneé R Berry
*Attorney, Agent, or Firm*—Pollock, Vande Sande & Amernick; Joseph P. Abate

[57] ABSTRACT

Recesses in a semiconductor structure are selectively plated by providing electrical insulating layer over the semiconductor substrate and in the recesses followed by forming a conductive barrier over the insulating layer; providing a plating seed layer over the barrier layer; depositing and patterning a photoresist layer over the plating seed layer; planarizing the insulated horizontal portions by removing the horizontal portions of the seed layer between the recesses; removing the photoresist remaining in the recesses; and then electroplating the patterned seed layer with a conductive metal using the barrier layer to carry the current during the electroplating to thereby only plate on the seed layer.

In an alternative process, a barrier film is deposited over recesses in an insulator. Then, relatively thick resists are lithographically defined on the field regions, on top of the barrier film over the recesses. A plating base or seedlayer is deposited, so as to be continuous on the horizontal regions of the recesses in the insulator, but discontinuous on their surround wall. The recesses are then plated using the barrier film without seedlayers at the periphery of the substrate wafers for electrical contact. After electroplating, the resist is removed by lift-off process and exposed barrier film is etched by RIE method or by CMP.

Also provided is a semiconductor structure obtained by the above processes.

24 Claims, 3 Drawing Sheets

METHOD TO SELECTIVELY FILL RECESSES WITH CONDUCTIVE METAL

TECHNICAL FIELD

The present invention is concerned with a process for fabricating metal wires in an integrated circuit. More particularly, the present invention is concerned with using a highly conducting barrier film to conduct electrical current and selectively plate recesses such as troughs and vias in a substrate. In particular, the present invention provides methods for the fabrication of multilevel wiring for chip interconnections. This is achieved by selectively plating recesses in a semiconductor substrate with conductive metal such as copper or gold. Only the trenches and vias in the insulator are plated. No plating occurs in the field regions above the recesses in the substrate. This selective deposition process reduces the subsequent polishing time for removing undesired plated metal overburden. Moreover, the present invention minimizes the problem of "dishing" as well as minimizing the erosion of the dielectric layer adjacent to the isolated conductive features or regions. Moreover, the present invention is concerned with semiconductor structures and nonsemiconductor structures prepared by the inventive processes of the present invention.

BACKGROUND OF INVENTION

Various techniques have been investigated and used for metallizing semiconductor chips. These methods include the lift-off process, thru-mask methods, metal RIE and metal and insulator damascene and various combinations of the abovemethods. The lift-off and thru-mask methods are more valuable for large features, like those typically encountered in chip packaging. Unlike the lift-off and the thru-mask, the metal RIE and damascene methods have been the process of choice for chip metallizations where the ground rules are typically below one micron.

In the damascene process, metal film is deposited over the entire patterned substrate surfaces to fill trenches and vias. This is then followed by metal planarization to remove metal overburden and isolate and define the wiring pattern. When metal deposition is by electroplating or by electroless process, the plating is preceded by the deposition of a plating base or seedlayer over the entire surface of the patterned wafer or substrate. Also, layers that may improve adhesion, and prevent conductor/insulator interactions or interdiffusion are deposited between the plating base or seedlayer and the insulator.

In the metal RIE methods, blanket metal film is etched to define the conductor pattern. The gaps between the metal lines and vias are then filled with insulators. In high performance applications, the dielectric is planarized to define a flat metal level. One of the main advantages of the damascene process as compared to metal RIE is that it is often easier to etch an insulator as opposed to metal. Also, insulator gap fill and planarization may be more problematic.

In the metal damascene process, all the recesses in the insulator are first filled with metal before metal polishing. However, during the metal deposition into trenches and vias, all the narrower features become filled before their wider counterparts. Thus, all features with widths less than 2 microns will be filled before those with widths greater than 5 microns. Hence, to fill trenches or test pads with widths of 50 microns, the smaller recesses typically with widths less than 5 microns are overplated. During metal CMP, the additional time needed to remove the excess metal overburden on the overplated smaller features causes dishing on the larger features. Also, because of the prolonged polishing times, insulator adjacent may become severely eroded. Severe dishing and insulator erosion in large metal features is a source of yield loss, especially when the occur at lower levels. Here they cause trapped metal defects at the next higher level. The longer time needed to remove the thicker metal overburden on the smallest metal lines and vias is one of the main culprits responsible for the low thruput and yield losses in the metal CMP process.

Moreover, this last metal wiring level typically contains very wide metal lines for power bussing and large pads for wirebonds or C4 solder balls. In the CMP process, these relatively large metal structures are sensitive to dishing because of the prolonged polishing times. Accordingly, room exists for improving the metal deposition process.

SUMMARY OF INVENTION

An object of the present invention is to provide a process that permits reducing the time required for CMP of plated damascene structures, thereby increasing the thruput. An object of this invention is to provide a process that reduces dishing and minimizes any erosion of dielectric materials adjacent to isolated and non-isolated conductive features, thereby enhancing wiring yields and productivity.

In particular, the present invention is concerned with a method for using a highly conducting barrier film such as alpha-Ta to carry current and selectively plate recesses in semiconducting and non-semiconducting substrates. The method of the present invention comprises providing a substrate, and providing at least one major insulating surface of the substrate with recesses. A conductive barrier film such as alpha-Ta or TaN/alpha-Ta with resistivity in the range of 14 to 40 micro-ohm cm is formed over the insulating surface such as by sputtering. This is followed by the deposition of a plating base or seedlayer over the barrier layer. A resist is deposited over the plating seedlayer. The resist and seedlayer are polished off on all the field regions above the recesses, exposing the barrier layer. The resist remaining in the recesses is removed. The recesses in the substrate are electroplated with a highly conductive barrier film such as alpha-Ta to carry electrical current to the various isolated and non-isolated seedlayers in the recesses during the electrodeposition process. Accordingly, plating occurs on the seedlayer in the trenches and vias and not on other parts of the semiconductor substrate. After electroplating, a brief touch-up polish can be used, when desired, to remove the small isolated copper overburden and the barrier film. In a separate embodiment, the barrier film is selectively etched using $CF_4$ RIE (reactive ion etching) processes.

In another alternate embodiment of the invention, a barrier film such as alpha-Ta or TaN/alpha-Ta is deposited such as by sputtering over the recesses in the insulator. Then, relatively thick resists are lithographically defined on the field regions, on top of the barrier film over the recesses. A plating base or seedlayer is deposited, so as to be continuous on the horizontal regions of the recesses in the insulator, but discontinuous on their surrounding walls. The recesses are then plated using the barrier film without seedlayers at the periphery of the substrate wafers for electrical contact. Here, there is no resist at the periphery of the substrate because of edge bead removal step, and this barrier film at the edge is also protected from seedlayer deposition. After electroplating, the resist is removed by lift-off process and exposed barrier film is etched by RIE method or by CMP.

A further aspect of the present invention is concerned with a semiconductor substrate that contains semiconductor or circuit structures located on at least one of its major surfaces. Electrical insulating layers with recesses are provided over the major surface. A conductive barrier layer is located over the insulating layer and a plating base or plating seedlayer is located over the conductive barrier within the recesses only. An electroplated conductive metal is located in the recesses only or within the recesses and regions of the major surface immediate and adjacent to the recesses, and not on other portions of the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
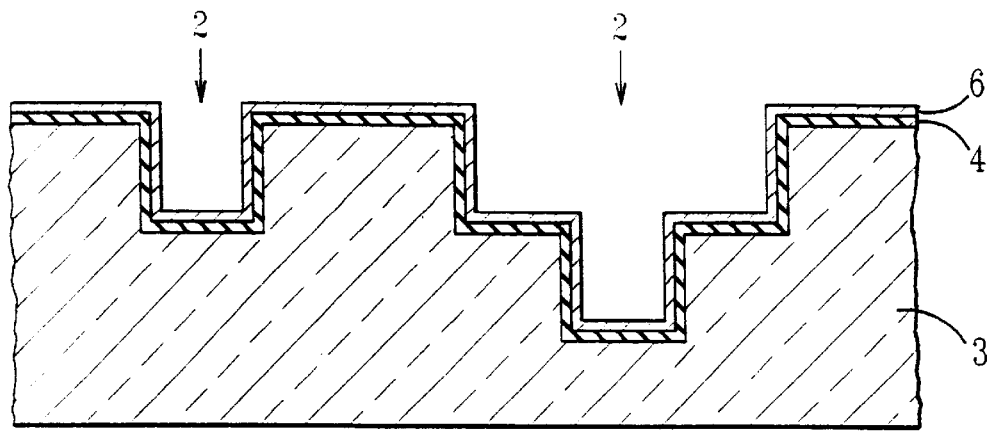
FIGS. 1–7 are schematic diagrams showing the sequence of steps in accordance with the present invention.

In accordance with the present invention, recesses 2 such as troughs and vias are provided on at least one major surface of a semiconductor substrate (not shown). Typical semiconductor substrates include silicon and group III–V semiconductors. Electrical insulation 3 is provided over the major surface and in the recesses such as silicon dioxide which can be thermally grown or deposited such as by chemical vapor deposition or physical vapor deposition. Typically, the insulating layer is about 2000 to about 30,000 Å thick, and more typically about 4000 to about 20,000 Å thick.

Next, a conductive barrier 4 is provided over the insulating layer. Preferably, a layer of tantalum nitride is first sputter deposited over the insulating layer to a thickness of about 15 to about 500 Å and more typically to a thickness of about 50 to about 300 Å to act as adhesion promoting layer between the insulating layer and subsequently to be applied tantalum layer. Next a tantalum layer is preferably sputtered over the tantalum nitride. The tantalum layer is alpha-tantalum. Typically, the thickness of the tantalum layer is about 500 to about 5000 Å and more typically about 1000 to about 2000 Å. Also, alpha-Ta ($\alpha$-Ta) may be deposited directly over the insulator by sputtering methods. Typically, the thickness of the $\alpha$-Ta is about 500 Å to about 5000 Å, and more typically about 1000 Å to about 2000 Å. Also, if desired, a layer of tantalum nitride can be deposited over the alpha-Ta layer.

Next, a seed layer 6 is deposited over the barrier layer including on the walls and bottom of the recesses. The preferred seed layer is copper which can be deposited by sputtering or evaporation and preferably by sputtering. The copper is sputtered employing temperatures of less than about 150° C., preferably less than about 100° C., such as about 100° C. to about –10° C. The sputtering is preferably carried out in the absence of an anneal. This sputtering is typically carried out to provide a seed layer of about 100 Å to about 2000 Å and preferably about 400 to about 1000 Å. Also, the copper seed layer can be deposited by CVD methods or by electroless plating method.

Next a resist 7 is deposited over the seed layer using conventional techniques. Any of the well known resist materials known in the art can be employed. The resist is typically applied by spinning on or by spraying. The resist employed can be any conventional resist or even a photoresist, although in this embodiment the resist is not lithographically defined. An example of a type of resist material is based upon phenolic-formaldehyde novolak polymers. A particular example of such is Shipley AZ-1350 which is a m-cresol formaldehyde novolak polymer composition. Such is a resist composition and includes therein a diazo ketone such as 2-diazo-1-naphthol-5-sulfonic acid ester.

Figure 2:
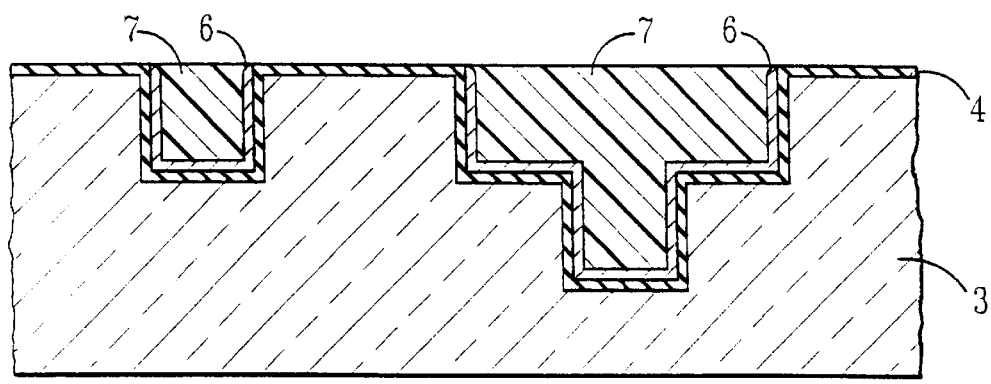

The resist 7 and the seed layer 6 are removed such as by chemical-mechanical polishing from the horizontal portions on the substrate between recesses 2 (see FIG. 2). The resist and seed layer are typically removed by chemical-mechanical polishing such as employing an aqueous polishing slurry containing abrasive particles such as colloidal silica.

Next, the remaining resist layer that protected the seed layer within the recesses from removal is removed such as by dissolving in a suitable solvent for the resist material.

Figure 3:
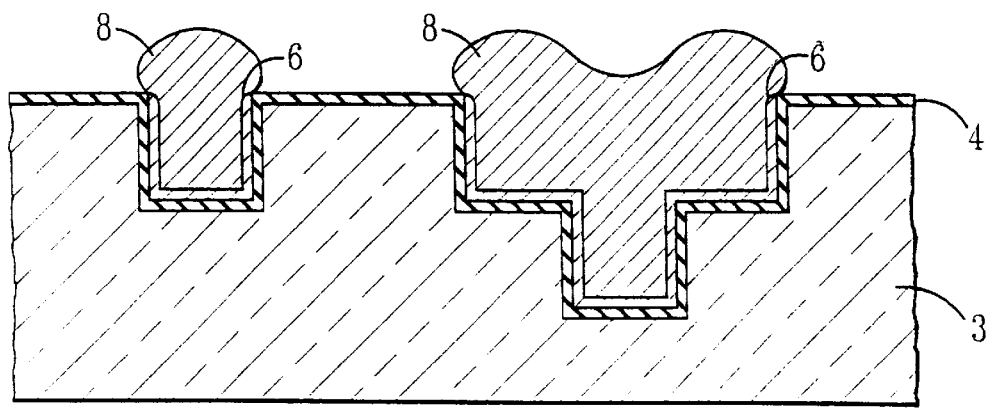

Conductive metal 8 such as copper is electroplated in the recesses on the seed layer 6 (see FIG. 3). Other suitable conductive metals are gold, nickel, cobalt and lead-tin alloys. The barrier layer 5 acts as a cathode terminal carrying the current during the electroplating. The conductive metal does not plate on the barrier layer 5 but instead preferentially plates on the seed layer. For instance, in the case of tantalum being the barrier layer 5, a superficial oxide layer (typically a monolayer) forms when such is exposed to the electroplating solution. Moreover, if desired, a superficial oxide layer can be formed on the barrier layer upon contact with the electroplating solution by changing the current for a short time, e.g. about 5 seconds, to anodize the top layer of the barrier layer. The copper can be plated employing an acidic copper plating bath. The plating bath includes a source of cupric ions and an inorganic mineral acid such as sulphuric acid. The preferred source of cupric ions is $CuSO_4 \cdot 5H_2O$. Typical copper plating baths contain the source of cupric ion in an amount of about $10^{-2}$ to about 0.5 molar. The inorganic acid is added to the plating bath in an amount such that the ionic strength of the bath is typically from about 5 molar to about 9 molar, and more typically about 1.5 molar to about 2.5 molar.

In addition, the bath can contain other additives such as brighteners including chloride ions such as in amounts of about 30 to about 70 ppm and organic brightener additives such as polyalkylene glycols. The organic brighteners are usually added in amounts of about 0.5 to about 1.25 percent by weight of the plating bath. The preferred polyalkylene glycols include polyethylene glycol and polypropylene glycol. The more typical polyethylene glycols and polypropylene glycols usually have molecular weights of about 400 to about 1000, and more typically about 600 to about 700. Furthermore, multicomponent organic additives can be employed such as those containing a polyalkylene glycol along with an organic sulfur-containing compound such as benzene sulfonic acid, safranine-type dyes and sulfo-organic aliphatic compounds including disulfides and/or nitrogen-containing compounds such as amides. Examples of amides include acrylamide and propyl amide.

For Cu, in the plating process, the structure to be plated is contacted with the plating bath. In addition, a soluble copper anode is placed in contact with the plating bath and includes such materials as phosphorized copper. The anode surface is generally at least about 1.5 times the surface area of the barrier layer which acts as a cathode terminal to carry current during the electroplating. The metal is plated on the seed layer at a current density of about 5 to about 50 milliamps (cm²). The plating is usually carried out at about normal room temperature (e.g. about 24° C.) to about 60° C.

The electroplating is continued until the recesses are filled with the conductive metal. This usually takes about 2 min. to about 10 min., more typically about 2½ min. to about 5 min. The thickness of the electroplate metal is typically about 4000 Å to about 30,000 Å, and more typically about 6000 Å to about 20,000 Å.

The conductive material 8 can then be chemically-mechanically polished to remove small amounts of metal above the surface of the recesses. Typical chemical-mechanical polishing slurries contain colloidal silica.

Figure 4:
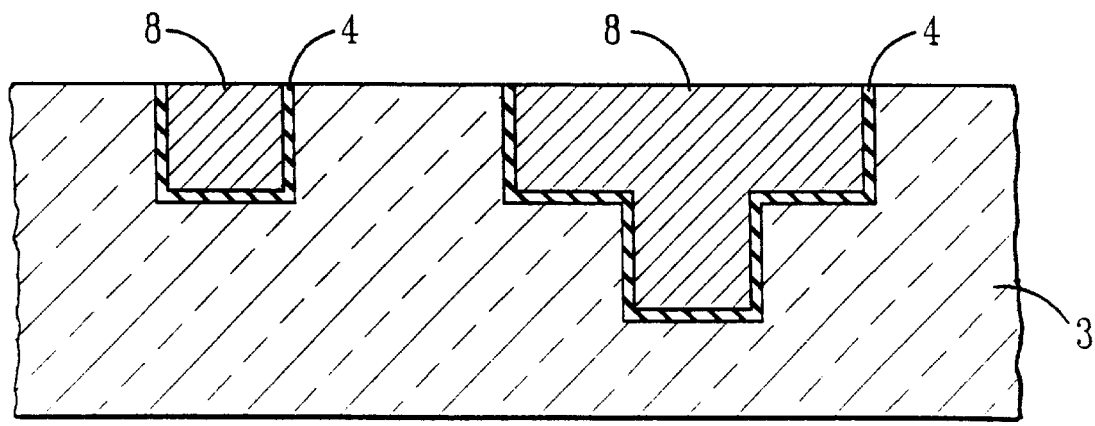

Next, the barrier layer 5 and plated metal is removed down to the insulating layer 3 (see FIG. 4). This removes conductive material from the horizontal portions between the recesses. The material can be removed by chemical-mechanical polishing such as any of the slurries disclosed above. The seedlayer and plated metal layer merge together because of e.g. copper recovery and grain growth at room temperature.

Figure 5:
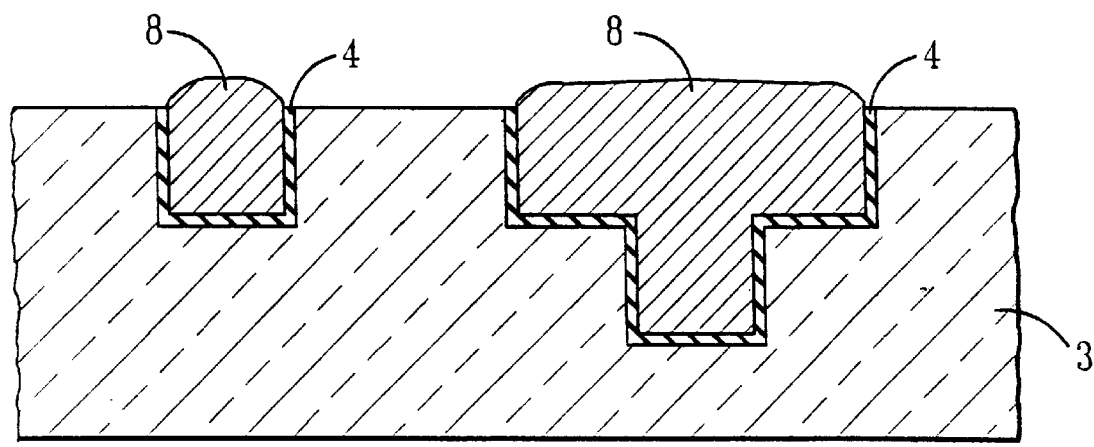

The barrier film can also be removed from the major surface of the substrate by RIE using a method selective to the plated copper such as $CF_4$ plasma (see FIG. 5).

According to an alternative process according to the present invention, recesses 2 such as troughs and vias are provided on at least one major surface of a semiconductor substrate (not shown). Electrical insulation 3 is provided over the major surface and in the recesses such as silicon dioxide which can be thermally grown or deposited such as by chemical vapor deposition or physical vapor deposition. Typically, the insulating layer is about 2000 to about 30,000 Å thick, and more typically about 4000 to about 20,000 Å thick.

Next, a conductive barrier 4 is provided over the insulating layer. Preferably, a layer of tantalum nitride is first sputter deposited over the insulating layer to a thickness of about 15 to about 500 Å and more typically to a thickness of about 50 to about 300 Å to act as adhesion promoting layer between the insulating layer and subsequently to be applied tantalum layer. Next a tantalum layer is preferably sputtered over the tantalum nitride. The tantalum layer is alpha-tantalum. Typically, the thickness of the tantalum layer is about 500 to about 5000 Å and more typically about 1000 to about 2000 Å. Also, alpha-Ta ($\alpha$-Ta) may be deposited directly over the insulator by sputtering methods. Typically, the thickness of the $\alpha$-Ta is about 500 Å to about 5000 Å, and more typically about 1000 Å to about 2000 Å.

Next a photoresist 7 is deposited over the barrier layer and then patterned using conventional lithographic techniques. Any of the well known photosensitive resist materials known in the art can be employed. The resist is typically applied by spinning on or by spraying. The photoresist employed can be a positive photoresist or a negative photoresist. A positive photoresist is one which on exposure to imaging radiation, is capable of being rendered soluble in a solvent in which the unexposed resist is not soluble. A negative resist material is one which is capable of polymerizing and/or insolublizing upon exposure to imaging radiation. An example of a type of photoresist material is based upon phenolic-formaldehyde novolak polymers. A particular example of such is Shipley AZ-1350 which is a m-cresol formaldehyde novolak polymer composition. Such is a positive resist composition and includes therein a diazo ketone such as 2-diazo-1-naphthol-5-sulfonic acid ester.

Figure 6:
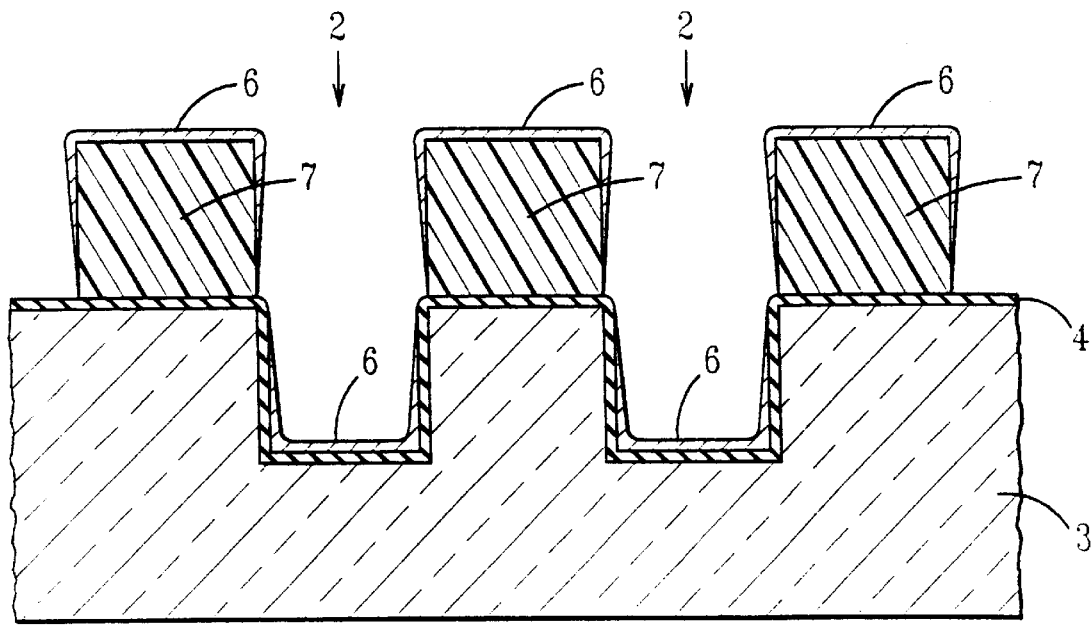

The photoresist is defined on the field regions on top of the barrier film over the recesses (see FIG. 6). The photoresist is relatively thick, typically about 1.5 to about 50 microns, and more typically about 1.5 to about 10 microns.

Next, a seed layer 6 is deposited so as to be continuous on the horizontal regions of the recesses in the insulator, but discontinuous on their surrounding walls.

The barrier film is exposed at the edge of the wafer by removing photoresist near the edge portion about up to 5 mm from the edge by dissolution in a suitable solvent. This technique is referred to as edge bead removal. The presence of a clamp ring at the edges over the wafer prevents seed layer from depositing in the vicinity of the edge. Here, there is no resist at the periphery of the substrate because of this edge bead removal step, and the barrier film at the edge is also protected from seedlayer deposition.

Figure 7:
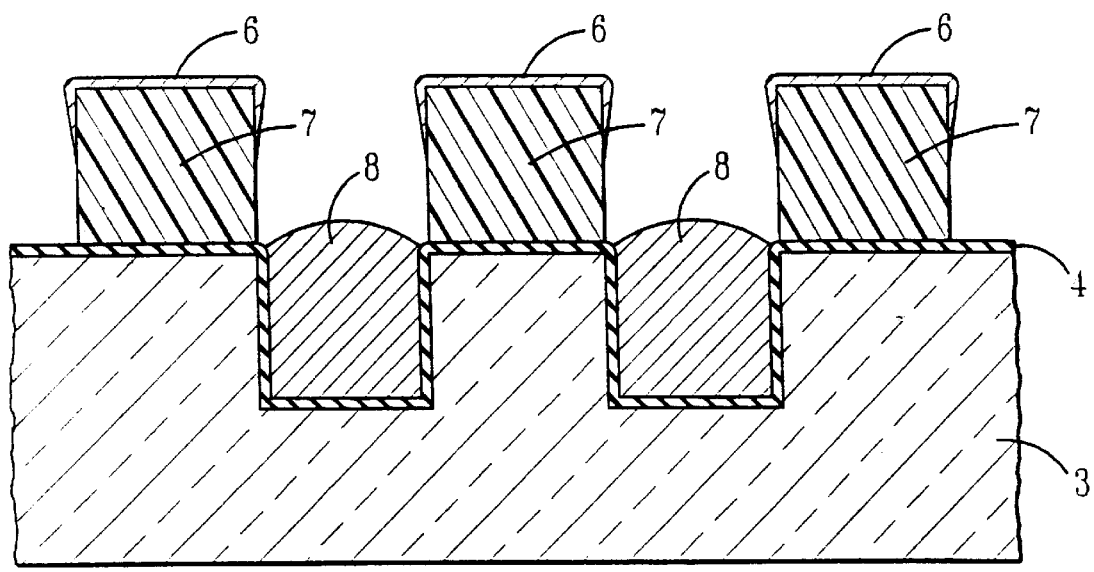

Conductive metal 8 such as copper is electroplated in the recesses on the seedlayer 6 (see FIG. 7). Other suitable metals are gold, nickel, cobalt, and lead-tin alloys. The barrier layer 5 acts as a cathode terminal carrying the current during the electroplating. The copper can be plated employing an acidic copper plating bath. In the plating process, the structure to be plated is contacted with the plating bath. In addition, an anode is placed in contact with the plating bath and includes such materials as phosphorized copper. The anode surface is generally at least about 5 times the surface area of the barrier layer which acts as a cathode terminal to carry current during the electroplating. The metal is plated on the seed layer at a current density of about 5 to about 50 milliamps/cm². The plating is usually carried out at about normal room temperature (e.g. about 24° C.) to about 60° C.

The electroplating is continued until the recesses are filled with the conductive metal. This usually takes about 2 min. to about 20 min., more typically about 2½ min. to about 10 min. The thickness of the electroplate metal is typically about 4000 Å to about 30,000 Å, and more typically about 6000 Å to about 20,000 Å. After electroplating, the resist is removed by lift-off process and exposed barrier film is etched by RIE method or by CMP.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for selectively plating recesses in a semiconductor substrate which comprises:

providing a semiconductor substrate;

providing at least one major surface thereof with recesses and providing electrical insulating layer over said at least one major surface and in said recesses;

forming a conductive barrier over said insulating layer;

forming a plating seed layer over said barrier layer;

depositing and patterning a photoresist layer over said plating seed layer for planarizing the insulated horizontal portions between recesses and for protecting said plating seed layer within said seed layer during subsequent planarizing;

then planarizing said insulated horizontal portions by removing the horizontal portions of said seed layer between recesses; removing the photoresist remaining in said recesses; and then electroplating the patterned seed layer with a conductive metal using said barrier layer to carry the current during said electroplating to thereby only plate on said seed layer.

2. The method of claim 1 wherein said conductive barrier is provided by sputter depositing a layer of tantalum nitride on said insulating layer and then sputter depositing a layer of tantalum on said tantalum nitride layer.

3. The method of claim 1 wherein said conductive barrier is alpha-tantalum.

4. The method of claim 2 wherein said conductive barrier is alpha-tantalum.

5. The method of claim 4 wherein the electroplating comprises electroplating copper.

6. The method of claim 3 wherein the electroplating comprises electroplating copper.

7. The method of claim 1 wherein said conductive barrier is provided by sputter depositing a layer of tantalum on said insulating layer and then sputter depositing a layer of nitrides of tantalum on said tantalum layer.

8. The method of claim 7 wherein said conductive barrier is provided by sputter depositing a layer of nitride of tantalum on said insulating layer and then sputter depositing a layer of tantalum on said tantalum nitride layer, such that the tantalum is in the alpha phase.

9. The method of claim 8 wherein the electroplating comprises electroplating copper.

10. The method of claim 2 wherein said tantalum nitride layer is about 15 to about 500 Å thick and said tantalum layer is about 500 to about 5000 Å thick.

11. The method of claim 1 wherein said seed layer is copper.

12. The method of claim 4 wherein said copper is deposited by sputter coating, CVD or electroless plating.

13. The method of claim 4 wherein said copper layer is about 4000 Å to about 20,000 Å thick.

14. The method of claim 1 wherein said horizontal portions of said seed layer between recesses is removed by chemical-mechanical polishing.

15. The method of claim 1 wherein said conductive metal is copper.

16. The method of claim 1 which further comprises removing said conductive barrier from horizontal portions between said recesses.

17. The method of claim 16 wherein said conductive barrier is removed by reactive ion etching.

18. A method for selectively plating recesses in a semiconductor substrate which comprises:

providing a semiconductor substrate;

providing at least one major surface thereof with recesses and providing electrical insulating layer over said at least one major surface and in said recesses;

forming a conductive barrier over said insulating layer;

depositing and patterning a photoresist layer over said barrier layer on field regions;

depositing a seedlayer wherein said seedlayer is continuous on the horizontal regions of the recesses in the insulator, but discontinuous on their surrounding walls;

exposing said barrier within the vicinity of the periphery of said major surface by edge bead removal of said seedlayer;

and then electroplating the patterned seed layer with a conductive metal using said barrier layer to carry the current during said electroplating to thereby only plate on said seed layer;

removing said resist by a lift-off process; and removing exposed barrier.

19. The method of claim 18 wherein said conductive barrier is provided by sputter depositing a layer of tantalum nitride on said insulating layer and then sputter depositing a layer of tantalum on said tantalum nitride layer.

20. The method of claim 19 wherein said conductive barrier is alpha-tantalum.

21. The method of claim 5 wherein the electroplating comprises electroplating copper.

22. The method of claim 10 wherein said tantalum nitride layer is about 15 to about 500 Å thick and said tantalum layer is about 500 to about 5000 Å thick.

23. The method of claim 18 wherein said conductive metal is copper.

24. The method of claim 18 wherein said photoresist layer is about 1.5 to about 50 Å thick.

* * * * *